United States Patent
Choi et al.

(10) Patent No.: US 7,412,872 B2
(45) Date of Patent: Aug. 19, 2008

(54) PROCESS FOR SCREENING OUTGAS EMISSIONS IN SEMICONDUCTOR PROCESSING

(75) Inventors: Hok-Kin Choi, San Jose, CA (US); Vani Thirumala, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 481 days.

(21) Appl. No.: 11/097,867

(22) Filed: Mar. 31, 2005

(65) Prior Publication Data

US 2006/0223202 A1    Oct. 5, 2006

(51) Int. Cl.
  *G01N 7/00* (2006.01)
(52) U.S. Cl. .............. 73/23.21; 73/23.22; 422/88; 422/89; 427/8; 427/248.1
(58) Field of Classification Search ............ 55/355; 60/276; 422/88, 89; 73/23.21, 23.22; 427/248.1, 427/8
See application file for complete search history.

(56) References Cited

U.S. PATENT DOCUMENTS

| | | | | |
|---|---|---|---|---|
| 4,308,233 A | * | 12/1981 | Narumiya et al. | 422/169 |
| 6,042,797 A | * | 3/2000 | Ogawa et al. | 423/213.2 |
| 6,206,971 B1 | * | 3/2001 | Umotoy et al. | 118/715 |
| 6,397,582 B1 | * | 6/2002 | Hanaoka et al. | 60/274 |
| 6,756,336 B2 | * | 6/2004 | Kasahara et al. | 502/65 |
| 7,181,903 B2 | * | 2/2007 | Yamato et al. | 60/275 |
| 7,207,669 B2 | * | 4/2007 | Pavlin | 347/100 |
| 2002/0148352 A1 | * | 10/2002 | Hirose et al. | 95/1 |

* cited by examiner

*Primary Examiner*—Bret Chen
(74) *Attorney, Agent, or Firm*—Blakely, Sokoloff, Taylor & Zafman LLP

(57) ABSTRACT

The present description relates to a process for measuring outgas emissions in fabrication chambers used for semiconductors, micromachines and the like. In one embodiment, the invention includes inserting a gas adsorption material into a processing chamber exhaust vent, running a process in the chamber, venting gasses in the chamber through the gas adsorption material, removing the adsorption material from the exhaust vent, and analyzing the adsorption material for gases.

19 Claims, 4 Drawing Sheets

PROCESS FOR SCREENING OUTGAS EMISSIONS IN SEMICONDUCTOR PROCESSING

BACKGROUND

1. Field

The present description relates to measuring outgas emissions in fabrication chambers and in particular to sampling outgas emissions during a process and analyzing the outgas samples offline.

2. Background

The manufacture of integrated circuit devices involves the sequential processing of a semiconductor wafer, usually silicon, gallium-arsenide, lithium-niobate or ceramic, to add or remove various layers of material, such as oxides, metals and silicon. The layers are formed by etching, washing, implanting, and depositing.

Photolithography is a process of patterning each layer on the wafer. As many as 35 masks may be required to pattern all of the layers on the wafer. A mask is fabricated by depositing an opaque material, such as chrome, on a transparent or reflective substrate, such as glass or quartz, and then etching the chrome to form features that are many times larger than the desired size on the wafer.

The wafer is covered with photoresist, a material that is sensitive to light. An exposure tool, such as a stepper, shines light through the mask onto the wafer. The optical system reduces the features of the mask so as to print a latent image with the correct dimensions in the photoresist on the wafer. After being exposed, the photoresist is developed to create openings corresponding to the location and intensity of light exposure. Thus, the photoresist serves as a stencil for transferring the pattern, originally in the mask, into the wafer by etching or ion implanting the underlying layers through the openings.

In order to reduce the minimum dimensions of the features on the wafer, the wavelength of the light is reduced and the optical reduction from mask to wafer is increased. These changes require greater accuracy in the optical system that transfers the mask pattern onto the wafer. Contaminants that find their way onto the optical system or onto many other components of the fabrication chamber can reduce the accuracy of the optical system and create errors in the finished product. Over time, the optical system and other components may be destroyed by the contaminants that have been released into a processing chamber by the photoresist, developers and other materials used in the fabrication process.

One source of contaminants is outgassing from the materials used to make the semiconductor. Many materials produce chemicals that are released as gasses into their surrounding environment. In normal room conditions and for some materials, this outgassing may be detectable as odors. The amount of gas produced depends on the environment. Different amounts of outgassing may occur with different light wavelengths, with different light intensities and with different temperatures. For many materials the amount of gas is increased when the material is heated, illuminated and placed in a vacuum. These conditions are common in semiconductor manufacturing and especially during photolithography.

While designers try to select materials with low levels of outgassing, it is difficult to obtain accurate information. Since the amount of outgassing varies in different environments, measurements that are made using test equipment may not reflect the conditions inside an actual fabrication chamber.

DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
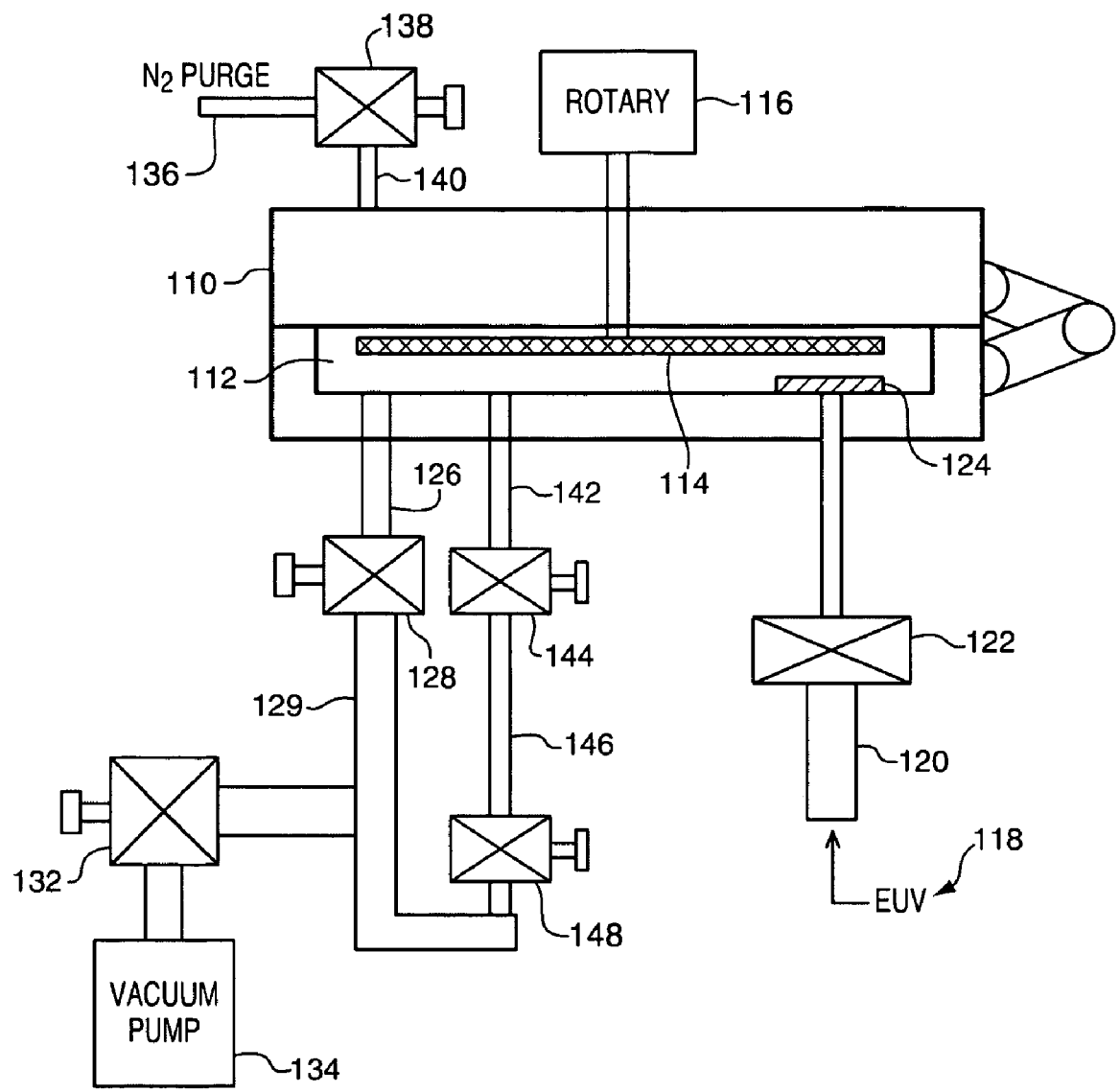
FIG. 1 is a diagram of a fabrication chamber suitable for use with an embodiment of the invention.

FIG. 1 provides an example of a processing chamber and related equipment that might be used to produce semiconductors, liquid crystals, nano-machines, microelectronic mechanical devices, flat panels for displays, detectors and optical processing or other devices. The processing chamber 110 has an inner vacuum chamber 112 inside of which a wafer 114 or other substrate or device is processed. In the example of FIG. 1, the wafer is placed on a rotating table driven by an external rotary 116 to rotate the wafer into different processing stations within the chamber. In some cases, a deposition showerhead may be placed at each wafer position around the rotating platform. This allows a thick layer of photoresist or any other substance to be deposited in several steps. While the processing chamber of FIG. 1 resembles a multiple head stepper, the present invention may be applied to many different types of processes, processing chambers and wafers.

One process that may be performed in the chamber is the exposure of photoresist. To this end, FIG. 1 shows an EUV (Extreme Ultraviolet) light source 118 and associated optics 120 coupled to a shutter 122 to send light through a $Si_3N_4$ window 124 into the processing chamber. The light beam is controlled by the optics and the shutter to illuminate the surface of the wafer with a desired intensity and duration. FIG. 1 shows an example of a processing chamber that may be used for testing materials and processes. The optical system is protected by the $Si_3N_4$ window. In many common production chambers the optics are not protected at all. The window can be used as part of a test because it tends to trap nonvolatile gases. Analysis of the window after a process provides additional information about the outgassing of nonvolatile gases during a process.

The processing chamber is also coupled to chamber environmental controls. A first vent 126 is coupled through a valve 128 to a manifold 129. The manifold couples the chamber through a valve 132 to a vacuum pump 134 to evacuate the chamber. Other gas sources or sinks may also be coupled to the manifold depending on the circumstances. The vacuum pump may be used to control the pressure inside the chamber and to evacuate the chamber after certain processes.

A nitrogen source 136 is coupled through a nitrogen valve 138 to a purge gas tube 140. The purge gas tube feeds into the chamber so that nitrogen may be fed into the chamber. Together with the vacuum pump, the nitrogen purge gas source allows the chamber to be flushed with nitrogen and then evacuated.

A second vent 142 is coupled at one end to the chamber proximate the first vent 126. The second vent is coupled at its other end to the manifold 129 of the first vent. This allows the second vent to be coupled to the vacuum pump or to any other sources or sinks that are coupled to the manifold of the first vent. A first valve 144 allows the second vent to be closed proximate the processing chamber. A second valve 148 proximate the manifold allows the second vent to be closed off from the manifold. A coupling tube 146 between the two valves can be completely isolated from the chamber and the manifold by closing both valves. By opening both valves, the second vent may be coupled to the vacuum pump to act as a second vacuum outlet for the chamber.

The coupling tube or a portion of the coupling tube may be disconnected from the equipment shown in FIG. 1 to allow a gas adsorption material to be placed in the path of gases flowing through the coupling tube. In one embodiment, the entire coupling tube is removed and replaced by a gas desorption tube. An example of such a gas desorption tube is described with respect to FIGS. 2A, 2B and 2C. In another embodiment, the coupling tube has fittings that allow a gas desorption tube to take up a portion of the coupling tube. In another embodiment, the interior of the coupling tube may be opened up and gas adsorption materials placed inside.

By closing both valves for the second vent, the coupling tube may be opened up or removed without disturbing conditions inside the chamber. By closing the second vent valve 144 closest to the chamber and opening the valve 148 closest to the manifold, the coupling tube can be evacuated. In addition, by closing the first vent's valve to the processing chamber, and opening the second vent's valve, the processing chamber can be evacuated through the second vent and not the first vent. In one embodiment, the processing chamber is nitrogen purged using the nitrogen source 136 and the vacuum pump 134 together. By purging through the coupling tube, using the second vent as an exhaust vent and closing off the first vent, all of the gases purged out of the chamber flow through the adsorption materials in the second exhaust vent. The various valves may be used to control the times in the process at which gases are directed though the second vent and the times at which gases are directed through the first vent.

Figure 2A:
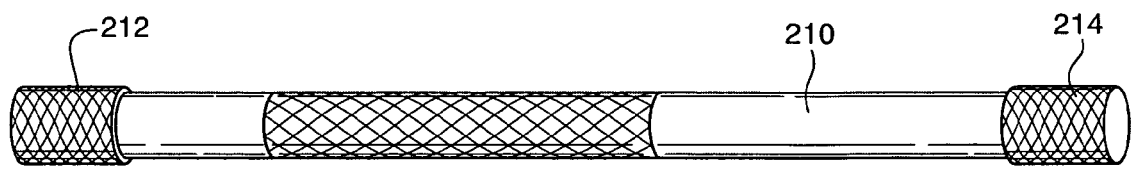
FIG. 2A is an elevation view of a desorption tube suitable for use with an embodiment of the invention.
Figure 2B:
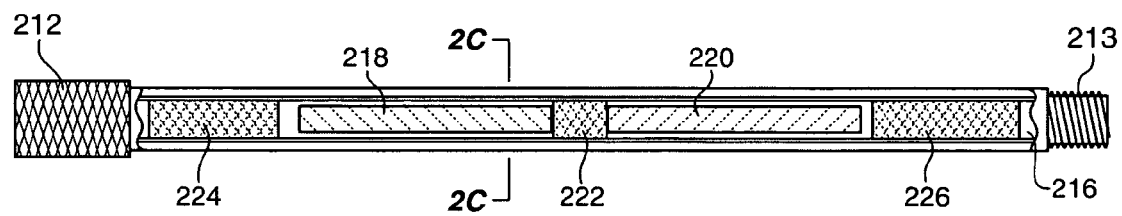
FIG. 2B is a cross-sectional diagram of the desorption tube of FIG. 2A.
Figure 2C:
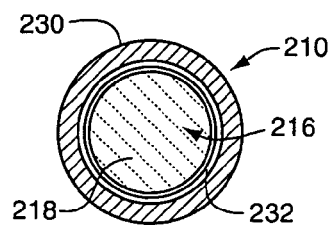
FIG. 2C is a cross-section diagram of the desorption tube of FIG. 2A across section 2C.

FIGS. 2A, 2B and 2C show an example of a gas desorption tube that may be used for some applications. Such a tube may be referred to as a thermal desorption packed tube. It may also be referred to as a gas adsorption tube. In the context of the present invention, the tube adsorbs gases in the chamber during a process. After the process is complete, the desorption tubes may be removed, then, in order to analyze the gases, the gases are desorbed from the tubes. The particular configuration and materials used for any gas desorption tube may be modified to suit different gases, processing chambers and equipment configurations.

As shown in FIG. 2A, the tube 210 has a long cylindrical shape with a durable exterior, made, for example, from extruded stainless steel. At each end, the tube has a fitting that allows it to be attached to the coupling tube or to the valves, depending on the equipment design. In FIG. 2A, the fittings are covered by stainless steel end caps 212, 214 to seal the tube interior.

In the cutaway view of FIG. 2B, the tube has the right side end cap 214 removed to show threads 213 while the left side end cap 212 remains in place. The tube has a cylindrical interior passageway 216 through which the gas to be sampled flows. Two different sampling material segments 218, 220 are placed in the interior passageway so that gases to be sampled pass through the sampling material. The two segments are separated by a short spacer 222 made for example of non-silanized glass wool. At both ends of the tube, between the end fittings and each sampling material segment 218, 220, the sampling material segments are isolated by quartz wool segments 224, 226.

The two sampling material segments may be made of the same or of different materials. In one example, an adsorbent porous polymer resin is used. For example, one segment may be made of Tenax-TA resin and the other segment may be made of Carboxen 59 resin. Tenax-TA is a 2,6-diphenylene-oxide polymer resin, with an average pore size of about 200 nm and an average density of about 0.25g/cc, while Carboxen 59 is a carbon molecular sieve. Other sampling materials may be used including Carbosieve SIII, Carbotrap, and Tenax GR among others. The particular type and amount of sampling materials may be selected depending on the particular substances to be adsorbed as well as flow rates, flow volumes and concentration levels.

FIG. 2C shows a cross-sectional view taken through a section of the tube as shown in FIG. 2B. The tube 210 has a stainless steel exterior shell 230, which is lined with inert glass 232. The glass lined interior passageway 216 is then filled with the sampling 218 and glass wool materials as mentioned above. In one embodiment, the tube with the glass liner is cleaned, silylated, solvent rinsed and air dried. The tube may then be packed with the indicated sampling material between the quartz wool plugs. The packed tubes may be conditioned by ramping the temperature to, for example, 320° C. and holding at this temperature for 4 hours under constant carrier gas flow. The tubes may then be cooled, capped and sealed with screw-on stainless steel end caps 212, 214 and PTFE (polytetrafluoroethylene) seals to maintain their state.

Figure 3:
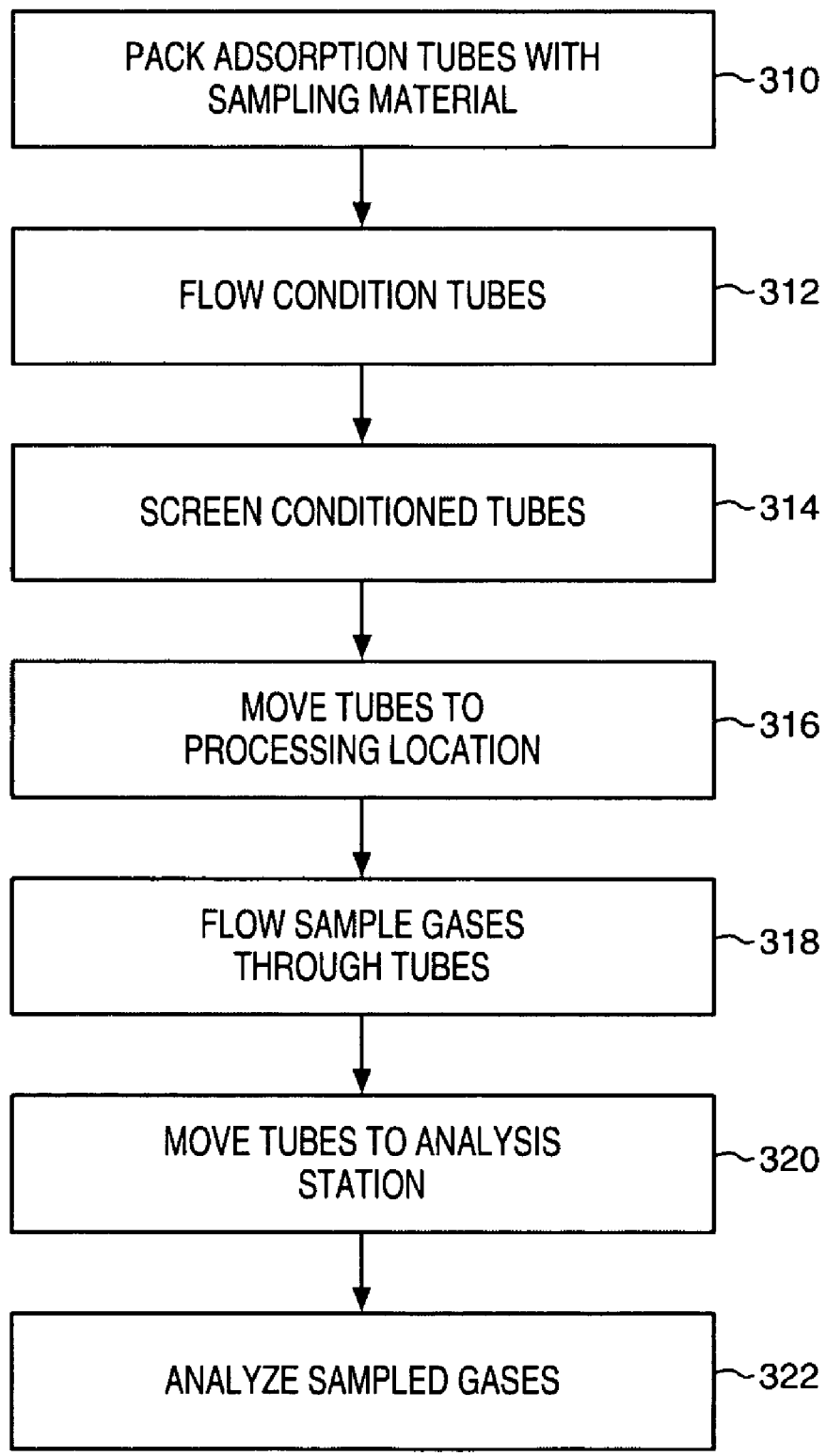
FIG. 3 is a process flow diagram of measuring outgas emissions according to one embodiment of the present invention.

FIG. 3 shows an example process flow according to an embodiment of the invention. In FIG. 3, the adsorption sampling tubes are first prepared for use. This may be done at the facility of a tube provider or at a testing facility or at the fabrication facility. Initially, at block 310, the tubes are packed with an adsorption sampling material, such as the materials mentioned above. At block 312, the tubes are flow conditioned. This may be done when the tubes are packed or at another facility. In one embodiment, the tubes are flow conditioned by a tube vendor and then flow conditioned a second time upon receipt. The flow conditioning may be done by flowing nitrogen through the tubes for 4-8 or more hours at a temperature from 300° C. to 330° C. An 8 hour conditioning at 320° C. works well for detecting gases released during photoresist exposure, however, other gases, temperatures and process times may provide better results for sampling other fabrication processes and other gases.

The tubes may then, at block 314, be analyzed for current adsorbed gas content. A variety of different analyses may be performed depending upon the gases that are to be detected. The pre-sampling screening of the tubes allows defective sampling materials to be detected and allows later tests to be compared against an original baseline. The pre-sampling screening analysis may be performed to accomplish both purposes or either one of the purposes. If the tubes are believed to be well quantified, then the screening analysis may be skipped. In one embodiment, the analysis is a gas chromatographic mass spectrometry method. Such an analysis may be used to give information about concentrations of many different gases in terms of line widths and heights across a range of light emission frequencies.

After conditioning and analysis, the tubes may be moved to the fabrication station at block 316. At the fabrication station, the tubes are exposed to the gas that is to be sampled, block 318. This is described in more detail with respect to FIG. 4. Using the types of adsorption materials mentioned above, gases from the fabrication process are flowed through the desorption tubes. Volatile gases will tend to adhere to active sites on the adsorption material. The tubes may then be shipped back to the analysis station at block 320 and then analyzed at block 322. The gases may be desorbed from the desorption tubes using an inert gas flow with thermal cycling. In one embodiment, the analysis is the same gas chromatographic mass spectrometry method that was applied in the pre-sampling screen. The resulting values can be directly compared to determine any changes. These changes may then be attributed to the gas exposure at the fabrication station.

Figure 4:
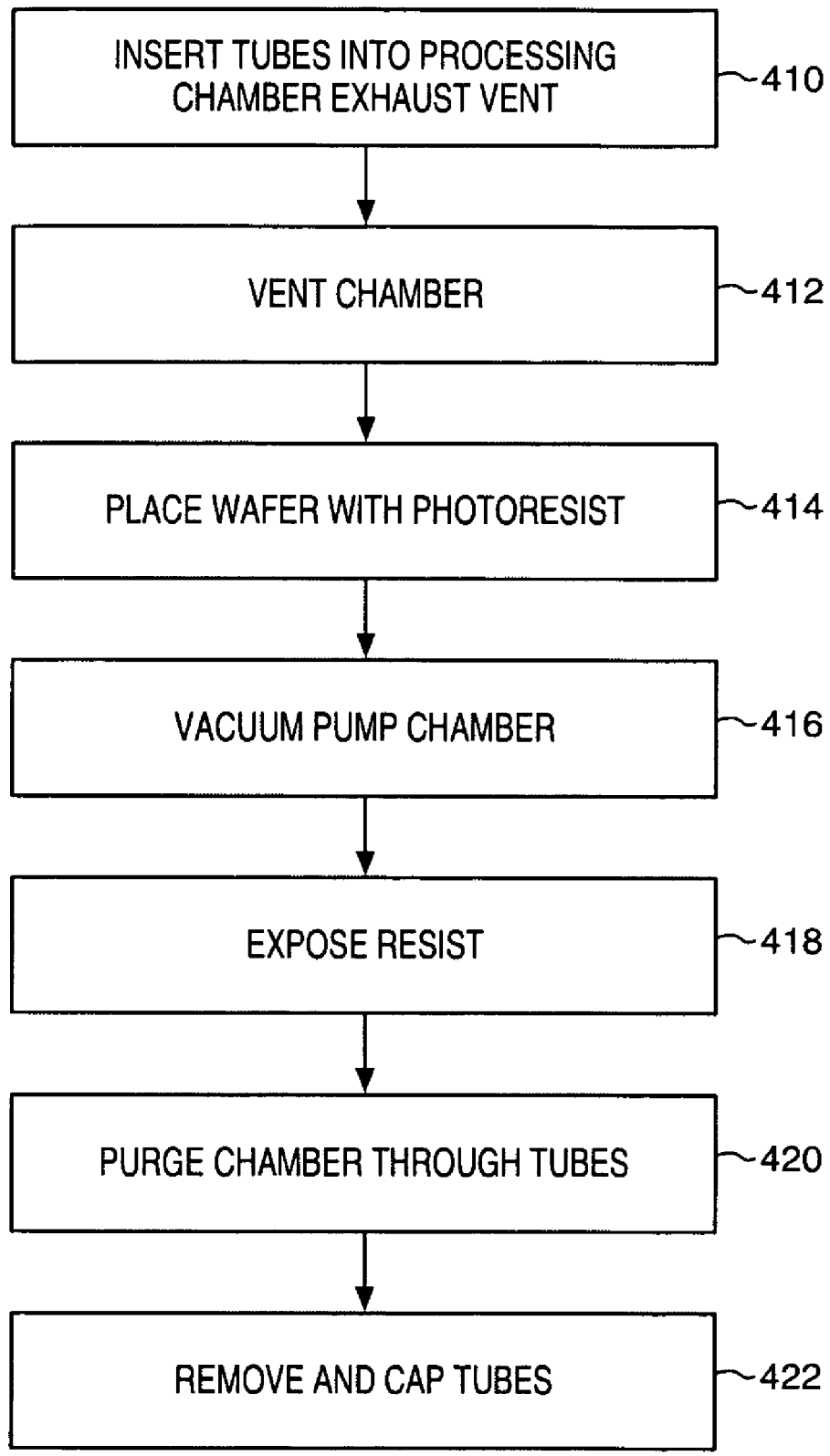
FIG. 4 is a process flow diagram of flowing sample gases through desorption tubes according to one embodiment of the present invention.

FIG. 4 provides one example of how prepared adsorption sampling tubes may be exposed to gases at the fabrication station. At block 410, the tubes are inserted into an exhaust vent of a fabrication chamber, such as the exhaust vent 146 of FIG. 1. This may be done by removing the tubes' end caps and inserting the tubes into corresponding fittings in the chamber's exhaust vent. Next, the sampling materials inside the sampling tube are exposed to the gases that are to be measured. In one embodiment, the tubes may be used to measure outgassing of photoresist materials that occur when the photoresist is being exposed.

For a photoresist outgassing measurement, the fabrication chamber is vented to atmosphere at block 412, then a wafer with photoresist is placed in the chamber at block 414. The processing chamber is pumped out by the vacuum pump (e.g. pump 134 of FIG. 1) at block 416. A vacuum for EUV exposure may be 1.0 to 0.1 microtorr. The wafer is then irradiated by an EUV beam at block 418. This exposes the photoresist under actual production conditions.

After the exposure, the fabrication chamber is purged with nitrogen and all of the chamber contents including the nitrogen purge gas are vented to atmosphere through the sampling tubes at block 420. The sampling tubes may then be removed from the exhaust vent and capped at block 422. The tubes may then be sent to the analysis station for an analysis of the gases that were adsorbed by the sampling materials in the tube.

The particular configurations, equipment, processes and process flows shown are provided as examples of embodiments of the present invention. Photoresist exposure is shown for illustration purposes, while embodiments of the invention may be applied to measure many different processes. Embodiments of the present invention may be applied to many types of processing chambers using many different types of sampling tubes in many different configurations. The particular materials described may also be substituted by other materials to accommodate different applications.

It is to be appreciated that a lesser or more complex sampling tube, fabrication chamber and process flow than the examples described above may be preferred for certain implementations. Therefore, the specific details may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known equipment, structures and techniques have not been shown in detail to avoid obscuring the understanding of this description.

While the embodiments of the invention have been described in terms of several examples, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising:
   inserting a removable gas adsorption tube into a semiconductor fabrication processing chamber exhaust vent, the gas adsorption tube containing gas adsorption material;
   running a process in the chamber;
   after running the process, venting gasses in the chamber through the gas adsorption tube for a predetermined period of time;
   disconnecting the gas adsorption tube from the chamber;
   removing the removable gas adsorption tube from the exhaust vent;
   desorbing gases from the gas adsorption tube to analyze the gases; and
   modifying the process based on the analysis.

2. The method of claim 1, further comprising inserting the adsorption material into the adsorption tubes, flow conditioning the adsorption tubes and then measuring any adsorbed gases before inserting the adsorption tubes into the exhaust vent, the adsorption tubes containing the adsorption material.

3. The method of claim 2, wherein the adsorption material comprises resins held in place by glass wool plugs.

4. The method of claim 3, wherein the resins comprise at least one of Tenax and Carboxen.

5. The method of claim 1, wherein running a process comprises exposing a photoresist layer that has been deposited on a substrate.

6. The method of claim 1, wherein running a process comprises ion implanting an oxide layer that has been deposited on a substrate.

7. The method of claim 1, wherein evacuating the gases comprises purging the chamber with nitrogen to drive any gases in the chamber that have been outgassed from materials during the process through the adsorption materials.

8. The method of claim 7, further comprising evacuating the process chamber before running the process.

9. The method of claim 1, wherein analyzing the gases comprises performing gas chromatography on the desorbed gases.

10. A method comprising:
    flow conditioning an adsorption sampling device having a cylindrical tube, an adsorption sampling material, an inner passageway within the tube to conduct the purge gasses through the adsorption material, glass wool plugs at each end of the inner passageway to retain the adsorption sampling material, and removable end caps, by removing the end caps and flowing a conditioning gas through the adsorption material;
    exposing the sampling device to processing chamber gases at a first location by removing the end caps and inserting the device into appropriate fittings of an exhaust vent of a semiconductor fabrication processing chamber so that, after a fabrication process is run, exhaust gases from the process flow through the inner passageway to be adsorbed by the sampling material;

disconnecting the device from the exhaust vent;

replacing the end caps onto the device; and analyzing the gases adsorbed by the sampling device at a second location, by desorbing adsorbed gases from the sampling material and analyzing the desorbed gases.

11. The method of claim 10, wherein flow conditioning comprises flowing nitrogen through the sampling device at a temperature sufficiently high to release adsorbed gases at the second location.

12. The method of claim 10, wherein exposing comprises opening a first exhaust vent valve to divert exhaust flow through the device and closing a second exhaust vent valve to prevent exhaust flow from bypassing the device.

13. The method of claim 10, wherein exposing comprises evacuating the semiconductor fabrication chamber through the sampling device.

14. The method of claim 10, wherein exposing comprises evacuating the chamber by purging the chamber with a purge gas through the sampling device after a semiconductor fabrication process has been performed in the chamber.

15. The method of claim 10, wherein analyzing the gases comprises performing gas chromatography on the desorbed gases.

16. The method of claim 10, further comprising modifying the semiconductor fabrication process based on the analysis.

17. The method of claim 10, wherein the adsorption material comprises resins held in place by glass wool plugs.

18. The method of claim 17, wherein the resins comprise at least one of Tenax and Carboxen.

19. The method of claim 10, further comprising analyzing the gases adsorbed by the sampling device after flow conditioning and before exposing the device to processing chamber gases to establish a baseline for analyzing the gases after exposing the device to the processing chamber.

* * * * *